(12) United States Patent
Foos et al.

(10) Patent No.: US 10,043,939 B2
(45) Date of Patent: Aug. 7, 2018

(54) TOP TO BOTTOM SOLUTION DEPOSITION OF METAL OXIDES

(71) Applicant: The United States of America, as represented by the Secretary of the Navy, Washington, DC (US)

(72) Inventors: Edward E. Foos, Alexandria, VA (US); Troy K. Townsend, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 161 days.

(21) Appl. No.: 15/266,878

(22) Filed: Sep. 15, 2016

(65) Prior Publication Data

US 2017/0069783 A1    Mar. 9, 2017

Related U.S. Application Data

(62) Division of application No. 14/256,263, filed on Apr. 18, 2014, now Pat. No. 10,014,434.

(51) Int. Cl.
| | |
|---|---|
| *H01L 31/18* | (2006.01) |
| *H01L 31/05* | (2014.01) |
| *H01L 31/0232* | (2014.01) |
| *H01L 31/0224* | (2006.01) |
| *C09D 5/24* | (2006.01) |
| *H01L 31/073* | (2012.01) |

(52) U.S. Cl.
CPC ........... *H01L 31/1884* (2013.01); *C09D 5/24* (2013.01); *H01L 31/02327* (2013.01); *H01L 31/022475* (2013.01); *H01L 31/0504* (2013.01); *H01L 31/0512* (2013.01); *H01L 31/073* (2013.01); *Y02E 10/50* (2013.01)

(58) Field of Classification Search
CPC ............. H01L 31/1884; H01L 31/0512; H01L 31/02327; H01L 31/022475; H01L 31/0504; H01L 31/073; C09D 5/24; Y02E 10/50
See application file for complete search history.

(56) References Cited

U.S. PATENT DOCUMENTS

2013/0196469 A1*   8/2013   Facchetti ............ C23C 18/1216
                                                            438/104

* cited by examiner

*Primary Examiner* — Peter F Godenschwager
*Assistant Examiner* — Andrew J. Oyer
(74) *Attorney, Agent, or Firm* — US Naval Research Laboratory; Roy Roberts

(57) ABSTRACT

A technique is described depositing a new formula of indium and tin salt solutions as a precursor to form a solid transparent indium tin oxide (ITO) film on non-conductive solid substrates. The utilization of this new composition of matter prompted the discovery of a method for preparing the first top-to-bottom completely solution processed solar cell. The specific patterning of the liquid-processed ITO precursor solution and the subsequent layers of a solar cell outlined here also demonstrate a unique way to connect solution processed (as opposed to deposited using vacuum techniques) solar cells in series and in parallel. Also disclosed are related methods for zinc tin oxide (ZTO), indium oxide (IO), indium zinc oxide (IZO), cadmium tin oxide (CTO), aluminum zinc oxide (AZO), and zinc oxide (ZO).

19 Claims, 8 Drawing Sheets

Layer 1

Layer 2

Layer 3

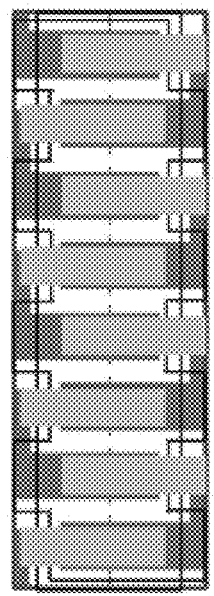
Layer 4
FIG. 5F
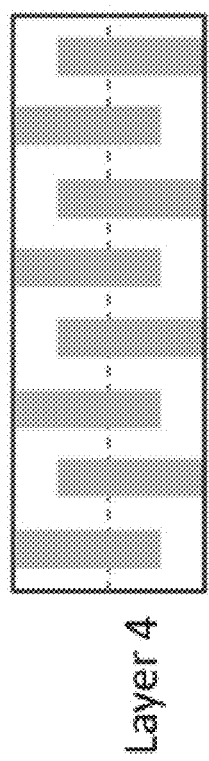
FIG. 5G
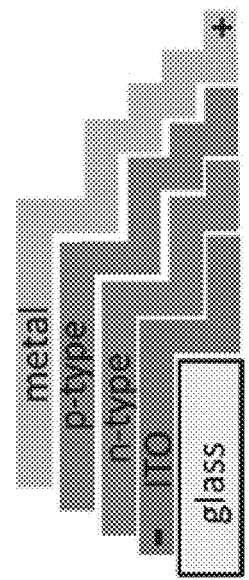
FIG. 5H
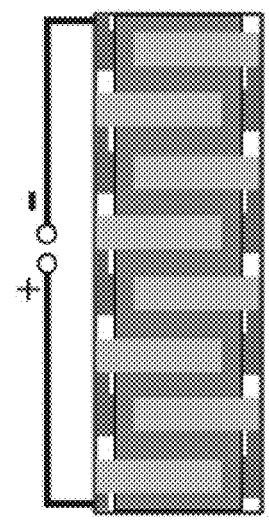
Complete module
(8 cells in series)

TOP TO BOTTOM SOLUTION DEPOSITION OF METAL OXIDES

BACKGROUND

Commercial indium tin oxide (ITO) films are used in a variety of optoelectronics, digital displays, touch panels, organic light-emitting diodes, optical coatings, gas sensors, electrochemical cells, and solar cells also termed photovoltaic (PV) devices. ITO is known for its high transmittance of visible light (80-90%) while maintaining high sheet conductivity (8-12 Ω/sq) and thermal stability (T<400° C.) (see ref. 2). Drawbacks to ITO include the limited freedom and high cost of deposition. ITO films are commonly deposited under specific atmospheric conditions by atomic sputter deposition onto glass or quartz at temperatures above 450° C., or the conventional solution process shown in FIG. 1. Recently, a report on solution based ITO demonstrated spin-cast films of indium nitrate and tin chloride dissolved in a solvent with a fuel and oxidizer (see ref. 1). Upon heating to temperatures ranging from 250-450° C., an exothermic reaction is initiated that produces extreme local temperatures hot enough to produce crystalline ITO (the combustion process shown in FIG. 1). In an iterative layer-by-layer process alternating between heating and spin coating, the ITO film can be deposited to the desired thickness. These films suffer from low transmittance, however, and contain a yellow colored solid material. In experiments with solar cells, they were also found to have lower conductivity than reported in the literature. In order to produce high quality ITO films that are both transparent to visible light (>80%) and conductive (<400 Ω/sq), a new formula for solution deposition of ITO is desired.

An answer to this problem would allow a solution ITO procedure to be applied to solar cells to produce the first all-solution inorganic solar cell. Solution processing of inorganic solar cells has been investigated by several groups (see refs. 3-9). Notable is the ITO/CdTe/CdSe/Al structure first demonstrated by Alivisatos et al. (2005) (ref. 7) where both CdTe and CdSe were spin coated onto ITO from solution of nanocrystals. Since then, other groups have included solution processed PbS, PbSe, and $CuInS_2$ among others. These inorganic nanocrystal cores were synthesized with an organic capping ligand to facilitate the material solubility. The inorganic core contains the cadmium chalcogenide semiconductor with a narrow band gap which can absorb visible light and produce an electron/hole pair as a result of the absorbed photon. These charges can be collected by the ITO or Al contact to produce light driven power. While some of these devices employ a solution processed contact (i.e. AgNWs (ref. 10), Ag paint (ref. 11), graphite (ref. 12), each of these examples; however, still use vacuum sputtered transparent conductive oxides (TCOs), (refs. 4, 6, and 10-18), e-beam evaporated metal contacts (ref. 4, 6, and 13-18) or metal contact substrates where the device was built on patterned copper (ref. 19). It is not believed that a complete PV device has been deposited via solution onto non-conductive substrates.

BRIEF SUMMARY

Described herein is a technique for depositing a new formula of indium and tin salt solutions as a precursor to form a solid transparent indium tin oxide (ITO) film on non-conductive solid substrates. The utilization of this new composition of matter prompted the discovery of a method for preparing the first top-to-bottom completely solution processed solar cell. The specific patterning of the liquid-processed ITO precursor solution and the subsequent layers of a solar cell outlined here also demonstrate a unique way to connect solution processed (as opposed to deposited using vacuum techniques) solar cells in series and in parallel to amplify light driven voltage and current, respectively based on novel layer-by-layer masking patterns.

One embodiment is a composition for forming indium tin oxide (ITO), the composition consisting essentially of: a solution of a tin salt, an indium salt, ammonium nitrate, ammonium hydroxide, and a solvent of 2-methoxyethanol or water, wherein, upon heating a thin film formed from the solution, the composition is capable of forming a substantially transparent ITO film having a sheet resistance of <300 Ω/sq.

Another embodiment is a composition for forming metal oxides, the composition consisting essentially of: a solution of (a) a nitrate of zinc, indium, cadmium, or aluminum, (b) optionally tin chloride, (c) ammonium nitrate, and (d) ammonium hydroxide, all in a solvent of 2-methoxyethanol or water, wherein the composition is capable of forming zinc tin oxide (ZTO), indium oxide (IO), indium zinc oxide (IZO), cadmium tin oxide (CTO), aluminum zinc oxide (AZO), or zinc oxide (ZO).

In a further embodiment, a method of creating indium tin oxide (ITO) includes forming a layer of a solution consisting essentially of a tin chloride, an indium(III) nitrate, ammonium nitrate, ammonium hydroxide, and a solvent of 2-methoxyethanol or water; and heating the layer to form ITO having a sheet resistance of <300 Ω/sq

BRIEF DESCRIPTION OF THE DRAWINGS

FIGS. 5A through 5H illustrate module design showing masking pattern for solution processed solar cells with ITO (Layer 1), n-type CdSe (Layer 2), p-type CdTe (Layer 3), gold contact (Layer 4) and the completed cell top-down view and cross section view of completed layers (H). The layering process shows each individual layer (A,B,D,F) and the outline of each layer as the module is built (C,E,G).

DETAILED DESCRIPTION

Definitions

Before describing the present invention in detail, it is to be understood that the terminology used in the specification is for the purpose of describing particular embodiments, and is not necessarily intended to be limiting. Although many methods, structures and materials similar, modified, or equivalent to those described herein can be used in the practice of the present invention without undue experimentation, the preferred methods, structures and materials are described herein. In describing and claiming the present invention, the following terminology will be used in accordance with the definitions set out below.

As used in this specification and the appended claims, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

DESCRIPTION

In this disclosure, a new formula for solution processed ITO with superior properties is described along with its use in a solar cell, preferably an all-inorganic solar cell. The freedom of solution processing allows for the ability arrange the layers of a solar cell in different ways as desired. An efficient and easily producible masking pattern for layer-by-layer deposition of a solar cell with solution based ITO, Au, Pt, or Ag is also described for spin or spray deposition of inorganic solar cells. The masking pattern can also be applied to other devices (solar cells, light detectors, light emitting diodes, etc.) with a special emphasis on enabling large area (from 1 μm$^2$ to greater than 1 m$^2$) deposition on non-standard substrates which are not necessarily flat, smooth, or easily manipulated.

Transparent Conductive Solution

Commercial ITO contains a range of ratios of indium to tin oxides, and most common is 90% In$_2$O$_3$ to 10% SnO$_2$ by weight. With solution deposition, this ratio can be obtained easily along with a range of other ratios, with an upper limit to the solubility of each metal salt in the solution, and a lower limit as low as desired or measurable. The literature method (ref. 1) for this calls for a molar ratio of [12.7:0.217: 0.389:0.200:0.180:0.017] for [2-methoxyethanol (solvent): NH$_4$OH (pH stabilizer):acetylacetone (fuel):NH$_4$NO$_3$ (oxidizer):indium:tin (metal)]. By combining these metal salts in solution with a fuel (acetylacetone or urea) and oxidizer, low temperature heating (150-350° C.) initiates a highly exothermic combustion synthesis (Equation 1 example for zinc oxide combustion formation (ref. 1)).

$$3Zn(NO_3)_2 \cdot 6H_2O_{(s)} + 5CO(NH_2)_2 \rightarrow 3ZnO_{(s)} + 8N_{2(g)} + 28H_2O_{(g)} + 5CO_{2(g)} \quad \text{Eq.1}$$

Figure 1:
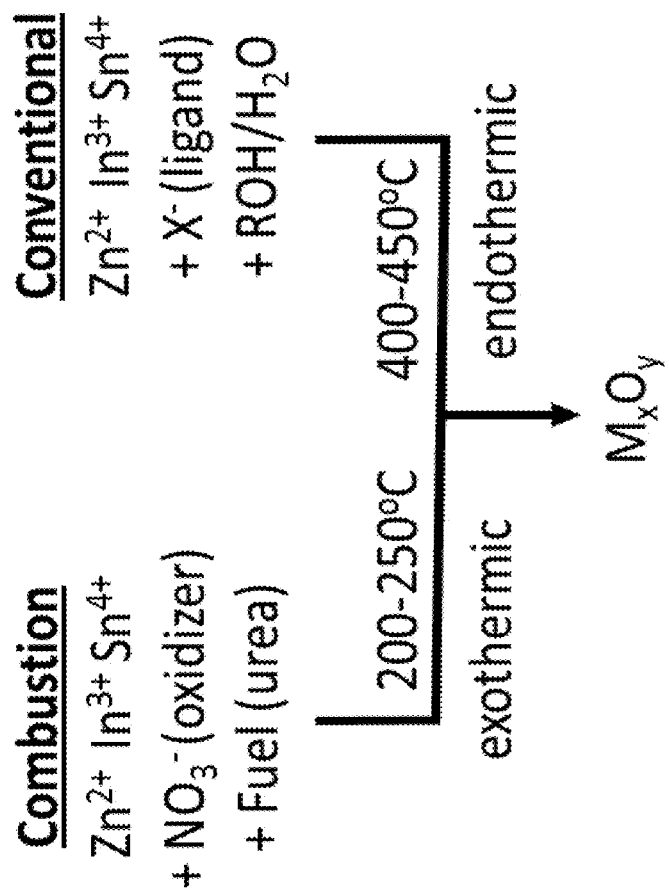
FIG. 1 shows a scheme illustrating low-temperature solution processing of metal oxide films compared to conventional solution deposition
Figure 2A:
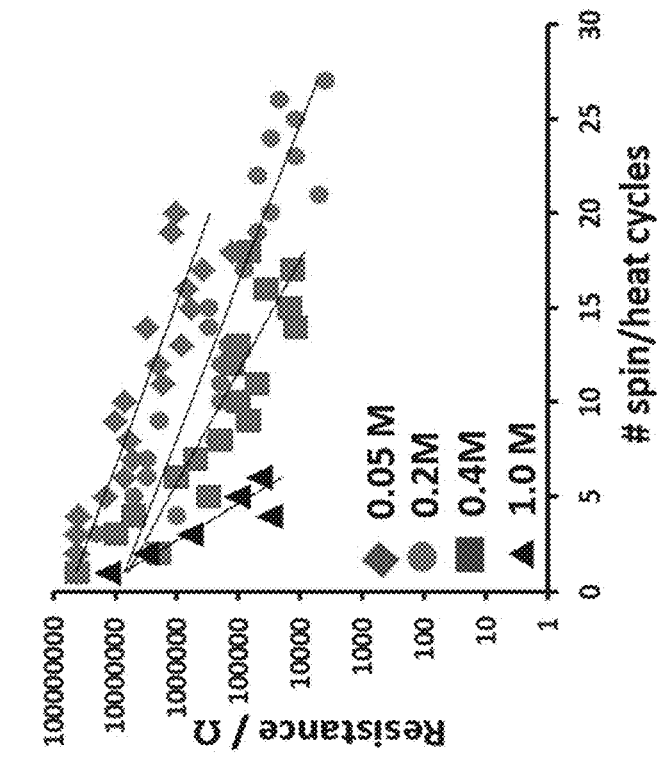
FIGS. 2A and 2B show absorbance of a combustion ITO film prepared according to ref. 1 after layered deposition at various indium molar concentrations (A) and resistance of the film as a function of layers for various concentrations (B).
Figure 2B:
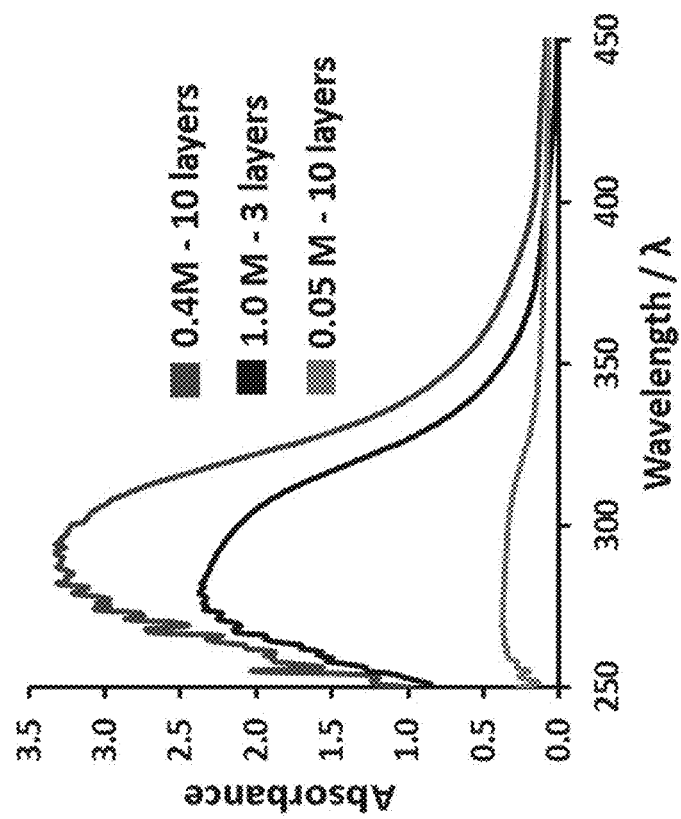

$\Delta H_{298K}$=−2320.4 kJ and $T_{ad}$~700° C.
contaminated with highly absorbing yellow powder and overall high resistances (>1000 Ω/sq as seen in FIG. 2B). It is possible that the yellow colored powder consists of acetylacetone (ACAC) and In$_2$O$_3$ residues and/or an indium-ACAC complex. Given that these compounds form a yellow solid upon heating, this leads to increased resistance in the film since these powders are not conductive. They also lead to increased absorbance in the visible region between 250-350 nm (FIG. 2A) which would account for the yellow color. The necessity for high transmittance in the visible region therefore requires that these reactions are avoided.

Surprisingly, the fuel (ACAC or urea) is not needed in this reaction and it was discovered that the fuel can be removed from the solution to produce films with 30× lower resistivity. Along with other modifications to the formula, the new mixture (Table 1) was developed that produces highly transparent films of ITO that are also conductive (<300 Ω/sq). The fuel component of the prior art mixture is not required and is contrary to the basic and novel characteristics of the new formula. However, it is possible to include dopants to improve electrical characteristics without disrupting the basic and novel characteristics of the new formula. A typical film preparation includes spin coating the solution at 4500 rpm and annealing at 380° C. for approximately 15 min for each new layer.

TABLE 1

Comparison of molar concentrations (mol/L) of reagents used in the literature method of ref. 1 and the optimized formula

| Reagents | Concentrations (M) Literature | New | Concentration Ratio (New/ Literature) | Actual Amounts for New Solution |
|---|---|---|---|---|
| SnCl$_2$•2H$_2$O | 0.017 | 0.158 | 9.43 | 0.357 g |
| In(NO$_3$)$_3$•2.85H$_2$O | 0.180 | 0.832 | 4.63 | 2.93 g |
| NH$_4$NO$_3$ | 0.200 | 1.04 | 5.20 | 0.83 g |
| NH$_4$OH | 0.217 | 0.242 | 1.11 | 167 μL |
| 2-methoxyethanol | 12.68 | 12.68 | 1 | 10 mL |
| ACAC | 0.3896 | — | — | — |

Figure 3A:
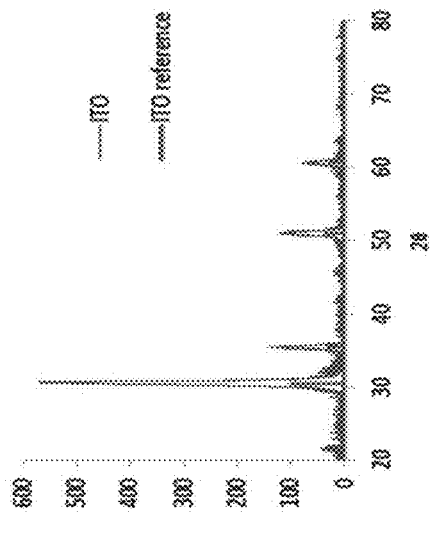
FIGS. 3A through 3D show characterization of the ITO prepared as described herein with UV/Vis Transmittance [A], x-ray diffraction (XRD) [B], and scanning electron microscopy (SEM) [C] with optimization of the Sn content showing film resistance plotted as a function of Sn to In wt. % in the film for increasing numbers of layers (1-6) [D].
Figure 3B:
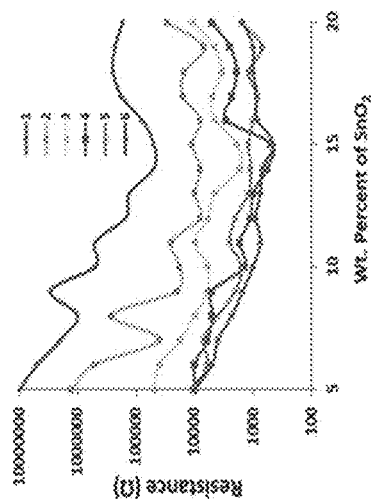
Figure 3C:
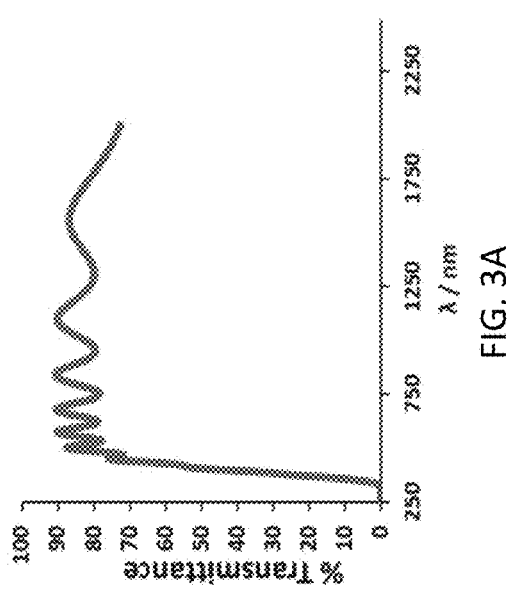
Figure 3D:
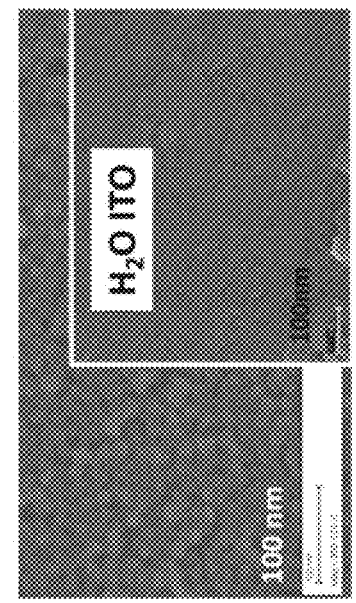
Figure 7A:
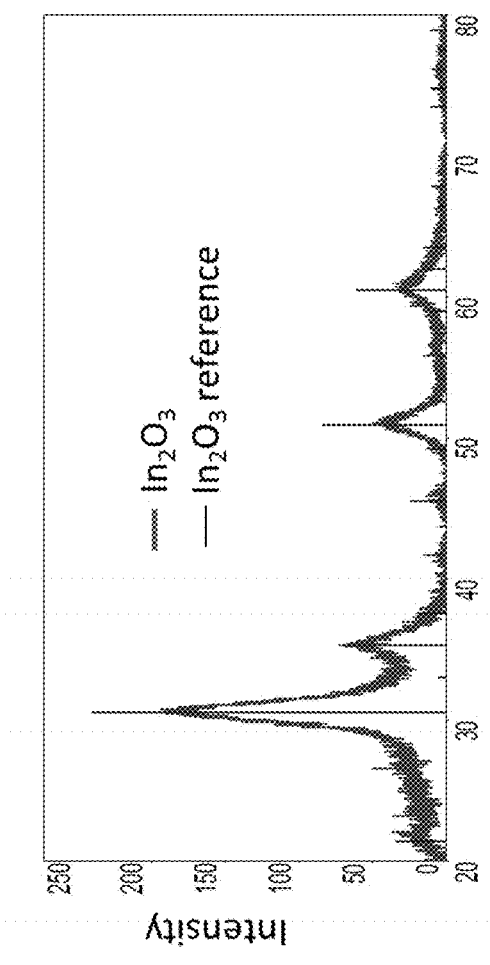
FIG. 7A shows an X-ray diffraction pattern for $In_2O_3$ made as described herein as compared to reference values.
Figure 7B:
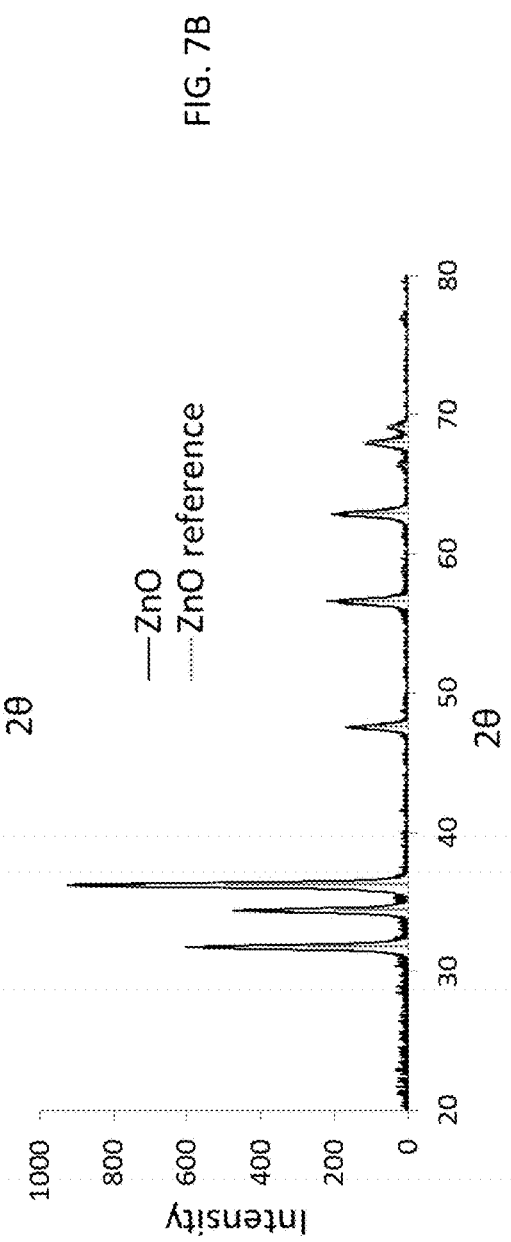
FIG. 7B shows an X-ray diffraction pattern for ZnO made as described herein as compared to reference values.

This iterative process builds the film thickness to approach the desired conductivity (which increases with film thickness) while maintaining high transmittance (which decreases with film thickness). A subsequent layer should not be heated longer than the previous layer since this causes cracking in the lower films. The material can also be spray cast using an airbrush at the same concentration as used for spin coating, or it can be diluted with solvent. Film quality is shown with SEM, XRD and UV/Vis in FIGS. 3A through 3C. The weight percent ratio of which is normally 10%:90%, respectively, in commercial ITO, was optimized by experimentation. Surprisingly, it was discovered that 15% SnO$_2$ was optimal for this method (FIG. 3D). In embodiments, SnO$_2$ is present in an amount ranging from 14%-16% by weight, 13%/17% by weight, or 12%-18% by weight, with the remaining percent In$_2$O$_3$, measured with regard to the total weight of the hydrated forms of SnO$_2$ and In$_2$O$_3$ described in Table 1. It is not believed that the hydration state is critical, so that, for example, equivalent amounts of anhydrous forms could be used. Furthermore, this new formula can be applied to other transparent conductive metal oxides such as zinc tin oxide (ZTO), indium oxide (IO), indium zinc oxide (IZO), cadmium tin oxide (CTO), aluminum zinc oxide (AZO), zinc oxide (ZO) to produce higher quality films by removing organic residue from the ACAC ligands and reducing processing times. ITO, IO, IZO and ZO have been tested in the lab. FIG. 7A shows an X-ray diffraction pattern for In$_2$O$_3$ made as described herein as compared to reference values. FIG. 7B shows an X-ray diffraction pattern for ZnO made as described herein as compared to reference values.

Replacing the 2-methoxyethanol solvent with water also met with some success. The films were spun in the same manner; however, the glass was pre-treated with concentrated NaOH rinsing to create better adhesion between the hydrophobic glass and the water solution. This method as initially performed was time-sensitive, and it was found that the metal salts precipitate after 1 hour in solution. However, because the organic content of the metal oxide film appears detrimental to optical transmission and conductivity, an all aqueous system may be advantageous for some applications. The SEM image (FIG. 3C inset) shows the $H_2O$-ITO surface with larger grains than ITO prepared as described here ("NRL-ITO"), indicating the combustion process here leads to a more continuous film.

All-Solution all-Inorganic Solar Cell

Figure 4:
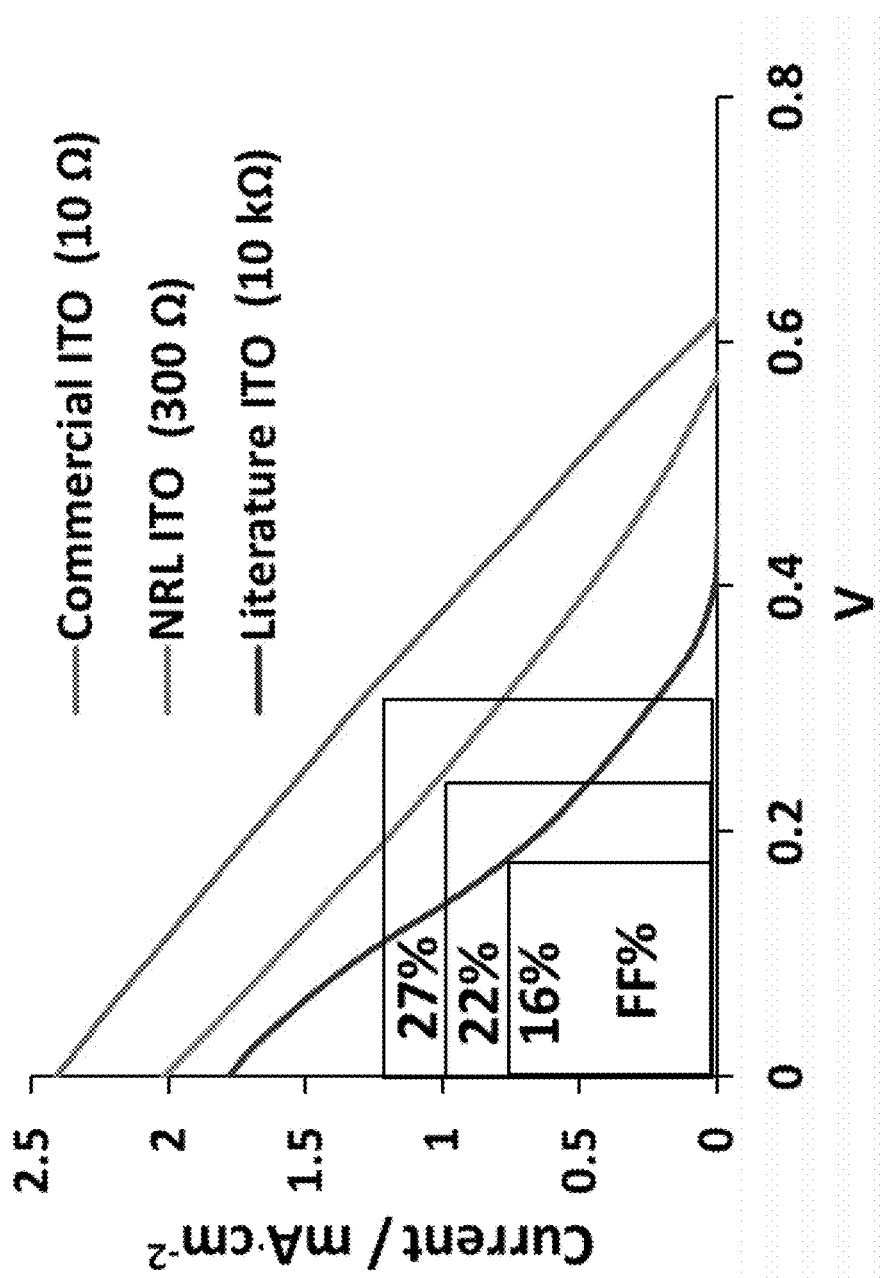
FIG. 4 shows photovoltaic I-V curves of ITO|CdSe|CdTe|Au single devices built on commercial ITO, ITO made as described herein ("NRL ITO"), and Literature ITO.

The above-described new ITO formula (having <300 $\Omega$/sq) was applied to a working photovoltaic device to produce what is believed to be the first all-solution all-inorganic solar cell. This was then compared to a similar device built on commercial ITO (8-12 $\Omega$/sq) and a separate device built on ITO made from the literature procedure (>10 k$\Omega$/sq) with the configuration of ITO/CdSe/CdTe/Au. The I-V data (FIG. 4) measured with a Keithley 617 source meter under ~1 sun illumination shows the dependence of the resistance on the fill factor (FF=[I·V]/[$I_{sc}$·$V_{oc}$]).

The inverted slope of the I-V curve for the literature ITO sample is consistent with high resistance on the ITO contact. The fill factor is improved from FF=16% (Literature ITO) to 22% (NRL ITO) to 27% (Commercial ITO) in addition to an increase in the current and voltage, leading to a two-fold increase in device efficiency between Literature ITO and NRL ITO. Therefore, not only does this new formula save processing time (1 h vs. 5 h), it also leads to a higher quality film of ITO for improved properties for optoelectronic applications including solar cells, light detectors, and other devices.

Solution Processed Solar Cell Module Patterned Masks

Working solar cells were made using the solution processed ITO. Solar cells contain an active layer sandwiched between two metal contacts. Usually, a transparent conductive material (ITO, FTO) is purchased or vacuum deposited, followed by the active layers (semiconductors for inorganic cells or dyes for organic cells), and finally topped with an evaporated metal electrode to produce a solar cell (see ref. 7, incorporated by reference herein for disclosing methods of forming solar cells from solution). The ITO and metal serve as the anode and cathode for the solar cell to produce a voltage/current during illumination with a light source. This produces light-driven power for one cell. Solar cell modules contain individual cells that are connected in series (ITO-cell 1 to metal-cell 2 to ITO-cell 3, etc.) in order to sum the voltages of each cell. They can also be connected in parallel (metal-cell 1 to metal-cell 2 to metal-cell 3, etc.) to produce a sum of the photocurrents. A combination of series and parallel connections can be used to produce a module with the desired voltage and current.

Figure 5A:
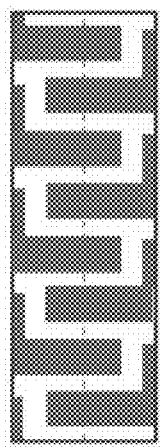
Figure 5C:
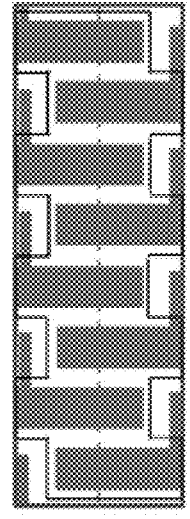
Figure 5E:
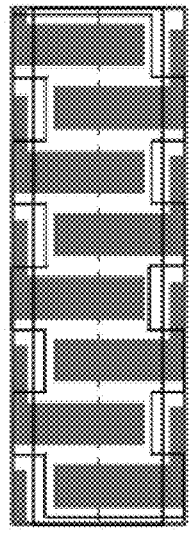
Figure 5B:
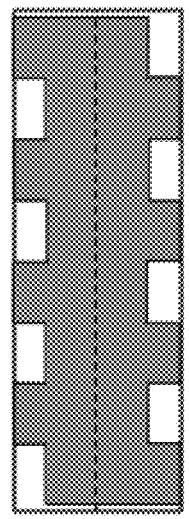
Figure 5D:
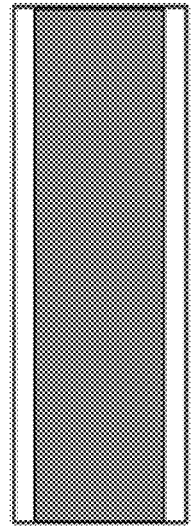

A technique was developed to pattern individual layers of a solution processed solar cell in ambient air to add voltage and current with a mask for spin-coated or spray cast solar cells. This pattern was then applied to an ITO/CdSe/CdTe/Au structure where all layers are solution processed. However, a similar technique could also be applied to non-solution processed solar cells, light detectors, or other electronic devices. Layer 1 is a bottom contact patterned with ITO on glass. The 3"×1" module consists of 8 (or more) cells connected in series. With this configuration, the total voltage of the module is the sum of each of the individual cell voltages (see equations in FIG. 6). Each ITO film is separated by high resistance glass so each cell is electrically separate. For the next layer, a semi-transparent n-type semiconductor window (CdSe, ZnO, etc.) was used. This layer also has low conductivity, so the material can be deposited as a continuous film overlapping each cell. If this layer is more conductive (i.e. CdS, Al-doped ZnO) the offset blocks in FIG. 5B would need to be separated. The active layer (p-type CdTe) also has low conductivity and can be sprayed as a continuous rectangle patch for simplicity (FIG. 5D). The solution deposited metal contact (Au/Ag) only comes in contact with Layer 3 (CdTe) of the cell and Layer 1 (ITO) of the adjacent cell. This prevents shorting pathways for the photogenerated charge.

Figure 6:
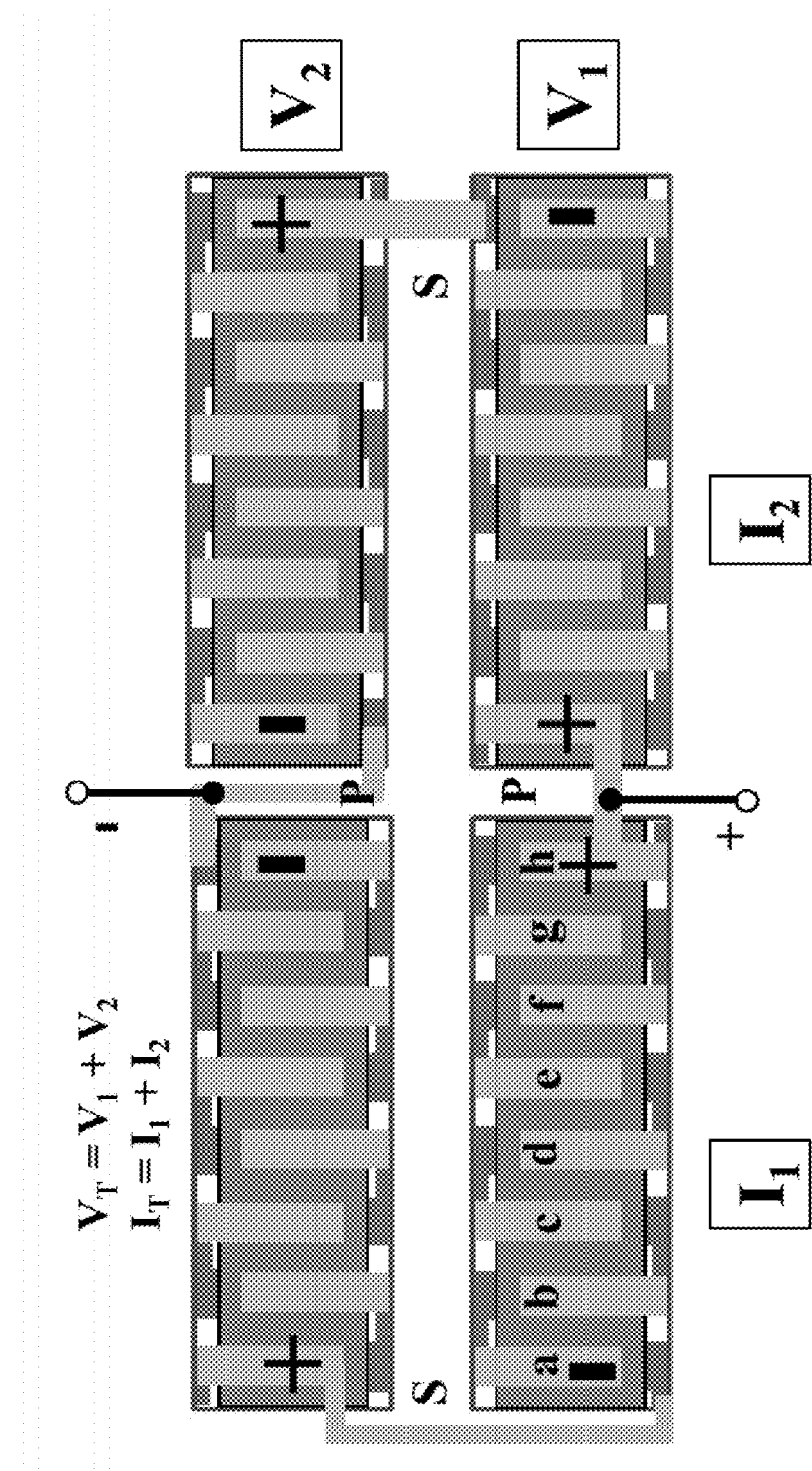
FIG. 6 illustrates an example of a sprayable panel onto a glass substrate consisting of 2-parallel circuits connected in series where the sprayable metal contact connects the 8-cell modules to amplify voltage and current.

An example of a panel is shown in FIG. 6 where the number of modules connected in series determines the maximum voltage and the number of modules connected in parallel determines the maximum current. In this case, a series connection (labeled S in the Figure) of two parallel modules (P) can create a total voltage that is the sum of 16 cells (VT=V1+V2) and a total current that is the sum of 2 modules (IT=I1+I2). Additional series or parallel connections (not shown) can be added to amplify the voltage or current, respectively. In addition, larger device areas produce larger currents, and in this way the masking pattern can be manipulated to build a module with specific power requirements in mind. Given the flexible nature of this design, spray processed thin film solar modules can be fabricated using the appropriate layer masks on a variety of substrates. Preliminary test devices produced over 4.0 V, 20 µA in room light with the configuration shown in FIG. 6 using ITO/CdSe/CdTe/Au on four 1 in×3 in glass microscope slides. Flat rectangular glass was used, however, curved or irregular shapes could be used as a substrate. This serpentine masking pattern can also be modified to use a circular or spiral geometry (i.e., to produce curved modules) as long as the basic design remains the same. Flexible plastic substrates may also be used if the film annealing temperatures are brought below the melting point of the substrate (T≈250° C.).

Solution processing offers a vital cost reduction due to the added potential advantage of high throughput roll to roll printing on large and flexible surfaces.

Another opportunity arises with this design where the cells can also be inverted to spray a module onto non-transparent substrates (for example metal, ceramic, etc.). In this case, the reflective metal contact should be deposited first followed by the active layers and finally a transparent conductive top contact. This top layer could be solution processed transparent metal oxides (like ITO) or transparent metallic films (metal nanowires, graphene, carbon nanotubes). Additionally, any combination of p/n materials could be used here and is not limited to CdSe or ZnO/CdTe. A specific architecture and spray deposition procedure is described in U.S. patent application Ser. Nos. 14/051,226 and 14/051,134, both filed on Oct. 10, 2013 that is compatible with both the solution ITO and the masking procedure disclosed here. These applications are incorporated herein by reference for teaching deposition techniques.

In summary, disclosed here is a unique composition of matter for solution processing of indium tin oxide films which takes advantage of the removal of organic content and optimized component concentrations to produce superior quality ITO films with less processing time. This new formula enabled the construction of a solar cell made entirely of air-stable solution processed materials, thus allowing processing under normal atmospheric pressure and avoiding the need for more costly and complex techniques involving vacuum and/or evaporation. Manipulation of liquid material solutions facilitates spraying, spin-coating, dip-coating deposition procedures to produce electronic devices with substantially reduced net device costs when compared to conventional techniques. The top-to-bottom solution processed solar cell design was applied to development of an innovative ordering of device layers for scalable solar module designs based on a series of masking patterns.

CONCLUDING REMARKS

Described herein is an improved formula for solution processed ITO which produces spin coated or spray cast transparent conductive oxide films with enhanced properties and greatly reduced the processing time of about one fifth of conventional techniques. The improved formula was applied with other solution components to produce an entirely solution processed solar cell prepared from inorganic materials. Solution processing can lead to lower fabrication costs and ease of deposition onto large and irregular surfaces. The module design can be applied to these surfaces to produce on-site power sources with simple masking of a layer-by-layer deposition.

The improved formula for ITO combustion synthesis can be applied to other metal oxides for a wide variety of optoelectronic applications. For other cell architectures, the masking can be applied to single junction cells with one low work function metal contact, or the module layers can be reversed (with the reflective metal contact as the bottom layer) to deposit a solar module onto any desired surface that is compatible with the processing conditions.

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

REFERENCES

1. Kim, M. G., et al., *Low-temperature fabrication of high-performance metal oxide thin-film electronics via combustion processing*. Nature Materials, 2011. 10(5): p. 382-388.
2. Ellmer, K., *Past achievements and future challenges in the development of optically transparent electrodes*. Nature Photonics, 2012. 6(12): p. 808-816.
3. Javier, A. and E. E. Foos, *Nanocrystal Photovoltaic Paint Sprayed With a Handheld Airbrush*. IEEE Transactions on Nanotechnology, 2009. 8(5): p. 569-573.
4. Olson, J. D., et al., *CdTe Schottky diodes from colloidal nanocrystals*. Applied Physics Letters, 2010. 96(24): p. 242103.
5. Bezryadina, A., et al., *Mid-gap trap states in CdTe nanoparticle solar cells*. Applied Physics Letters, 2012. 100(1): p. 013508.
6. Barkhouse, D. A. R., et al., *Device characteristics of a 10.1% hydrazine-processed Cu2ZnSn(Se,S)4 solar cell*. Progress in Photovoltaics: Research and Applications, 2012. 20(1): p. 6-11.
7. Gur, I., et al., *Air-stable all-inorganic nanocrystal solar cells processed from solution*. Science, 2005. 310(5747): p. 462-465.
8. Jasieniak, J., et al., *Solution-Processed Sintered Nanocrystal Solar Cells via Layer-by-Layer Assembly*. Nano Letters, 2011. 11(7): p. 2856-2864.
9. Debnath, R., O. Bakr, and E. H. Sargent, *Solution-processed colloidal quantum dot photovoltaics: A perspective*. Energy & Environmental Science, 2011. 4(12): p. 4870-4881.
10. Chen, C.-C., et al., *Visibly Transparent Polymer Solar Cells Produced by Solution Processing*. ACS Nano, 2012. 6(8): p. 7185-7190.
11. Park, B., Y. Chan Kim, and S. H. Yun, *All-solution-processed inverted polymer solar cells with low temperature, water-processable hybrid electron-collecting layers*. Journal of Materials Chemistry A, 2013. 1(6): p. 2030-2038.
12. Nanu, M., J. Schoonman, and A. Goossens, *Nanocomposite Three-Dimensional Solar Cells Obtained by Chemical Spray Deposition*. Nano Letters, 2005. 5(9): p. 1716-1719.
13. Todorov, T. K., et al., *Solution-processed Cu(In,Ga)(S,Se)2 absorber yielding a 15.2% efficient solar cell*. Progress in Photovoltaics: Research and Applications, 2013. 21(1): p. 82-87.
14. Ju, T., L. Yang, and S. Carter, *Thickness dependence study of inorganic CdTe/CdSe solar cells fabricated from colloidal nanoparticle solutions*. Journal of Applied Physics, 2010. 107(10): p. 104311.
15. Sun, S., et al., *Controlled synthesis of CdTe nanocrystals for high performanced Schottky thin film solar cells*. Journal of Materials Chemistry, 2012. 22(36): p. 19207-19212.
16. MacDonald, B. I., et al., *Layer-by-Layer Assembly of Sintered CdSexTe1-x Nanocrystal Solar Cells*. ACS Nano, 2012. 6(7): p. 5995-6004.
17. Ming-Yi, L., et al. *All-solution-processed-inverted polymer solar cells on PET substrates with CuOx thin film as an anode interlayer, in Photovoltaic Specialists Conference (PVSC), 2010 35th IEEE*. 2010.
18. Tung, V. C., et al., *Towards solution processed all-carbon solar cells: a perspective*. Energy & Environmental Science, 2012. 5(7): p. 7810-7818.
19. Kim, T.-S., et al., *All-solution-processed ITO-free polymer solar cells fabricated on copper sheets*. Solar Energy Materials and Solar Cells, 2012. 98(0): p. 168-171.
20. Foos, E. E., et al., *Inorganic photovoltaic devices fabricated using nanocrystal spray deposition*. ACS Applied Materials & Interfaces, 2013, 5, 8828

The invention claimed is:

1. A method of creating indium tin oxide (ITO), the method comprising:
   forming a layer of a solution consisting essentially of a tin chloride, an indium(III) nitrate, ammonium nitrate, ammonium hydroxide, and a solvent of 2-methoxyethanol or water, wherein the solution is free of acetylacetone; and
   heating the layer to form ITO having a sheet resistance of <300 Ω/sq.

2. The method of claim 1, further comprising spraying or casting the solution onto a substrate prior to the heating.

3. The method of claim 1, further comprising forming additional layers from solution to create an optoelectronic device.

4. The method of claim 3, wherein a mask is employed to pattern individual layers.

5. The method of claim 4, wherein said optoelectronic device is a solar cell.

6. The method of claim 4, wherein said mask is employed in conjunction with a flexible substrate.

7. The method of claim 6, wherein said optoelectronic device is a solar cell.

8. The method of claim 3, first comprising depositing a reflective metal contact onto a non-transparent substrate to serve as said substrate.

9. The method of claim 3, wherein said optoelectronic device is a solar cell.

10. The method of claim 9, wherein masks are employed to pattern layers of different materials thereby forming a module comprising a plurality of cells electrically connected in series.

11. The method of claim 10, wherein said module is a solar module.

12. A method of creating a metal oxide, the method comprising:

forming a layer of a solution consisting essentially of a nitrate of zinc, indium, cadmium, or aluminum, optionally tin chloride, ammonium nitrate, ammonium hydroxide, and a solvent of 2-methoxyethanol or water, wherein the solution is free of acetylacetone; and heating the layer to form a metal oxide.

13. The method of claim 12, further comprising spraying or casting the solution onto a substrate prior to the heating.

14. The method of claim 12, further comprising forming additional layers from solution to create an optoelectronic device.

15. The method of claim 14, wherein a mask is employed to pattern individual layers.

16. The method of claim 14, wherein said optoelectronic device is a solar cell.

17. The method of claim 15, wherein said mask is employed in conjunction with a flexible substrate.

18. The method of claim 14, first comprising depositing a reflective metal contact onto a non-transparent substrate to serve as said substrate.

19. The method of claim 14, wherein said optoelectronic device is a solar cell.

* * * * *